United States Patent
Madan et al.

(10) Patent No.: US 8,811,057 B1
(45) Date of Patent: Aug. 19, 2014

(54) POWER REDUCTION CIRCUIT AND METHOD

(71) Applicant: Texas Instruments Incorporated, Dallas, TX (US)

(72) Inventors: Sudhir Madan, Richardson, TX (US); Hugh McAdams, Mckinney, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 14/051,946

(22) Filed: Oct. 11, 2013

Related U.S. Application Data (60) Provisional application No. 61/772,217, filed on Mar. 4, 2013.

(51) Int. Cl.
*G11C 5/14* (2006.01)
*G11C 11/22* (2006.01)

(52) U.S. Cl.
CPC ............ *G11C 5/148* (2013.01); *G11C 11/2297* (2013.01); *G11C 11/22* (2013.01)
USPC ............ 365/145; 365/149; 365/227; 365/229

(58) Field of Classification Search
CPC ........ G11C 5/144; G11C 5/148; G11C 11/22; G11C 11/2297; G11C 11/24; G11C 11/404; G11C 2207/2297
USPC .......................... 365/145, 149, 226, 227, 229
See application file for complete search history.

(56) References Cited

U.S. PATENT DOCUMENTS

| | | | | |
|---|---|---|---|---|
| 4,697,101 | A | * | 9/1987 | Iwahashi et al. ................. 326/80 |
| 5,400,275 | A | * | 3/1995 | Abe et al. ........................ 365/145 |
| 5,812,463 | A | * | 9/1998 | Park .......................... 365/189.05 |
| 2011/0211408 | A1 | * | 9/2011 | Koike et al. .................... 365/203 |

* cited by examiner

*Primary Examiner* — Tan T. Nguyen
(74) *Attorney, Agent, or Firm* — Rose Alyssa Keagy; Frederick J. Telecky, Jr.

(57) ABSTRACT

A method of reducing leakage current in a memory circuit is disclosed (FIG. 8A). The method includes connecting a first supply voltage terminal (VDD) to a bulk terminal of a transistor in an active mode of operation. The method further includes detecting a low power mode (SLEEP) of operation of the transistor and disconnecting the first supply voltage terminal from the bulk terminal in response to the step of detecting.

20 Claims, 8 Drawing Sheets

POWER REDUCTION CIRCUIT AND METHOD

CLAIM TO PRIORITY OF NONPROVISIONAL APPLICATION

This application claims the benefit under 35 U.S.C. §119 (e) of Provisional Appl. No. 61/772,217, filed Mar. 4, 2013, which is incorporated herein by reference in its entirety.

BACKGROUND OF THE INVENTION

Nonvolatile memory circuits such as electrically erasable programmable read only memories (EEPROM) and Flash EEPROMs have been widely used for several decades in various circuit applications including computer memory, automotive applications, and video games. Each of these nonvolatile memory circuits has at least one nonvolatile memory element such as a floating gate, silicon nitride layer, programmable resistance, or other nonvolatile memory element that maintains a data state when an operating voltage is removed. Many new applications, however, require the access time and packing density of previous generation nonvolatile memories in addition to low power consumption for battery powered circuits. One nonvolatile memory technology that is particularly attractive for these low power applications is the ferroelectric memory cell, which uses a ferroelectric capacitor for a nonvolatile memory element. A major advantage of these ferroelectric memory cells is that they require approximately three orders of magnitude less energy for write operations than previous generation floating gate memories. Furthermore, they do not require high voltage power supplies for programming and erasing charge stored on a floating gate. Thus, circuit complexity is reduced and reliability increased.

The term ferroelectric is something of a misnomer, since present ferroelectric capacitors contain no ferrous material. Typical ferroelectric capacitors include a dielectric of ferroelectric material formed between two closely-spaced conducting plates. One well-established family of ferroelectric materials known as perovskites has a general formula $ABO_3$. This family includes Lead Zirconate Titanate (PZT) having a formula $Pb(Zr_xTi_{1-x})O_3$. This material is a dielectric with a desirable characteristic that a suitable electric field will displace a central atom of the lattice. This displaced central atom, either Titanium or Zirconium, remains displaced after the electric field is removed, thereby storing a net charge. Another family of ferroelectric materials is Strontium Bismuth Titanate (SBT) having a formula $SbBi_2Ta_2O_9$. SBT has several advantages over PZT. Memories fabricated from either ferroelectric material have a destructive read operation. In other words, the act of reading a memory cell destroys the stored data so that it must be rewritten before the read operation is terminated.

Figure 1:
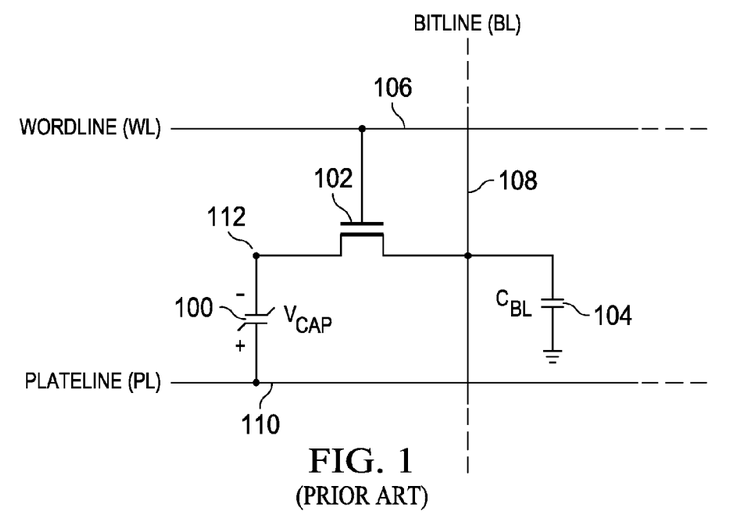
FIG. 1 is a circuit diagram of a ferroelectric memory cell of the prior art.

A typical one-transistor, one-capacitor (1T1C) ferroelectric memory cell of the prior art is illustrated at FIG. 1. The ferroelectric memory cell is similar to a 1T1C dynamic random access memory (DRAM) cell except for ferroelectric capacitor 100. The ferroelectric capacitor 100 is connected between plate line 110 and storage node 112. Access transistor 102 has a current path connected between bit line 108 and storage node 112. A control gate of access transistor 102 is connected to word line 106 to control reading and writing of data to the ferroelectric memory cell. This data is stored as a polarized charge corresponding to cell voltage $V_{CAP}$. Capacitance of bit line BL is represented by capacitor $C_{BL}$ 104.

Figure 2:
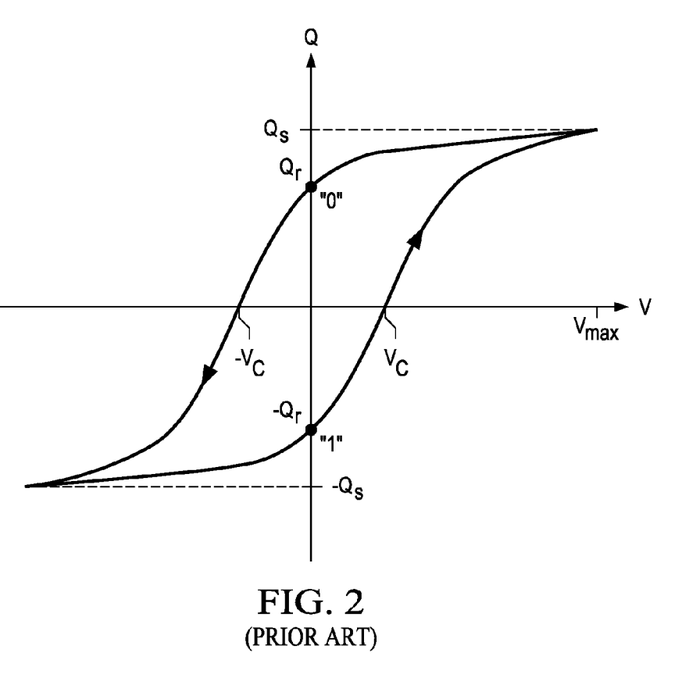
FIG. 2 is a hysteresis curve of the ferroelectric capacitor 100 of FIG. 1.

Referring to FIG. 2, there is a hysteresis curve corresponding to the ferroelectric capacitor 100. The hysteresis curve includes net charge Q or polarization along the vertical axis and applied voltage along the horizontal axis. By convention, the polarity of the ferroelectric capacitor voltage is defined as shown in FIG. 1. A stored "0", therefore, is characterized by a positive voltage at the plate line terminal with respect to the access transistor terminal. A stored "1" is characterized by a negative voltage at the plate line terminal with respect to the access transistor terminal. A "0" is stored in a write operation by applying a voltage Vmax across the ferroelectric capacitor. This stores a saturation charge Qs in the ferroelectric capacitor. The ferroelectric capacitor, however, includes a linear component in parallel with a switching component. When the electric field is removed, therefore, the linear component discharges and only the residual charge Qr remains in the switching component. The stored "0" is rewritten as a "1" by applying −Vmax to the ferroelectric capacitor. This charges the linear and switching components of the ferroelectric capacitor to a saturation charge of −Qs. The stored charge reverts to −Qr when the voltage across the ferroelectric capacitor is removed. Finally, coercive points $V_C$ and $-V_C$ are minimum voltages on the hysteresis curve that will degrade a stored data state. For example, application of $V_C$ across a ferroelectric capacitor will degrade a stored "1" even though it is not sufficient to store a "0". Thus, it is particularly important to avoid voltages near these coercive points unless the ferroelectric capacitor is being accessed. Moreover, power supply voltage across a ferroelectric capacitor must exceed these coercive voltages during a standby or sleep mode avoid data loss.

Figure 3:
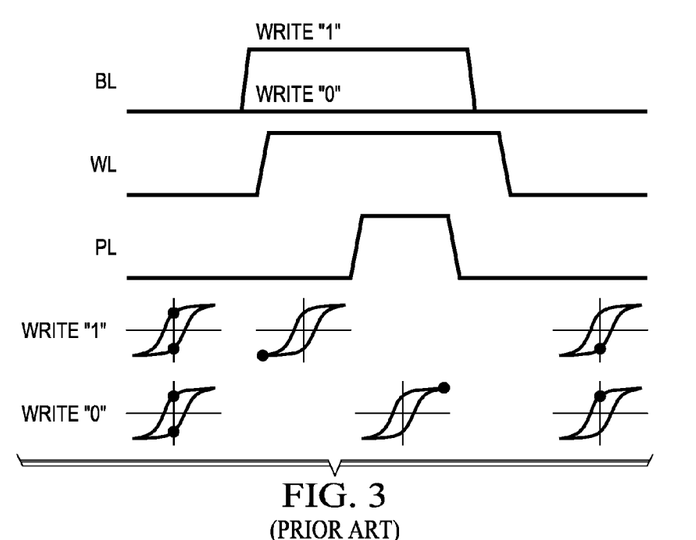
FIG. 3 is a timing diagram showing a write operation to the ferroelectric memory cell of FIG. 1.

Referring to FIG. 3, there is illustrated a typical write sequence for a ferroelectric memory cell as in FIG. 1. Initially, the bit line (BL), word line (WL), and plate line (PL) are all low. The upper row of hysteresis curves illustrates a write "1" and the lower row represents a write "0". Either a "1" or "0" is initially stored in each exemplary memory cell. The write "1" is performed when the bit line BL and word line WL are high and the plate line PL is low. This places a negative voltage across the ferroelectric capacitor and charges it to −Qs. When plate line PL goes high, the voltage across the ferroelectric capacitor is 0 V, and the stored charge reverts to −Qr. At the end of the write cycle, both bit line BL and plate line PL go low and stored charge −Qr remains on the ferroelectric capacitor. Alternatively, the write "0" occurs when bit line BL remains low and plate line PL goes high. This places a positive voltage across the ferroelectric capacitor and charges it to Qs representing a stored "0". When plate line PL goes low, the voltage across the ferroelectric capacitor is 0 V, and the stored charge reverts to Qr representing a stored "0".

Figure 4:
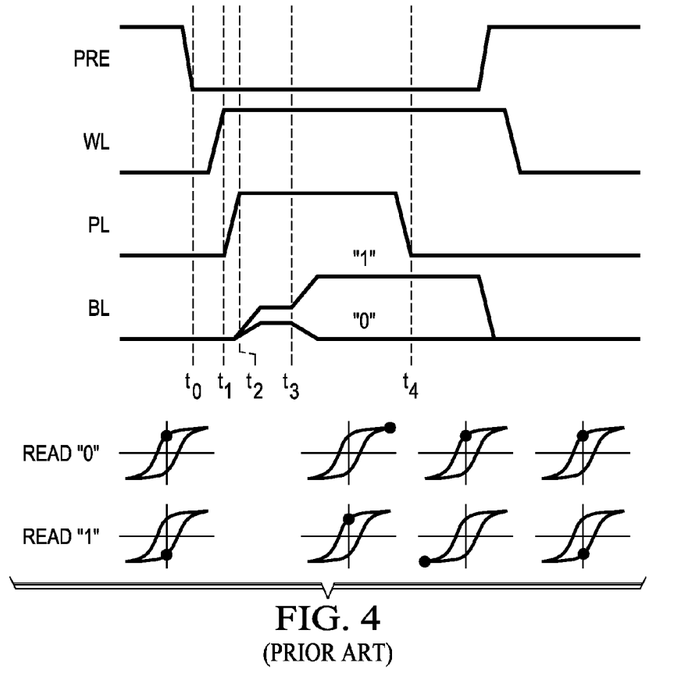
FIG. 4 is a timing diagram showing a read operation from the ferroelectric memory cell of FIG. 1.

A read operation is illustrated at FIG. 4 for the ferroelectric memory cell at FIG. 1. The upper row of hysteresis curves illustrates a read "0". The lower row of hysteresis curves illustrates a read "1". Word line WL and plate line PL are initially low. Bit lines BL are precharged low. At time $t_0$ bit line precharge signal PRE goes low, permitting the bit lines BL to float. At time $t_1$ word line WL goes high and at time $t_2$ plate line PL goes high. This permits each memory cell to share charge with a respective bit line. A stored "1" will share more charge with parasitic bit line capacitance $C_{BL}$ and produce a greater bit line voltage than the stored "0" as shown at time $t_3$. A reference voltage (not shown) is produced at each complementary bit line of an accessed bit line. This reference voltage is between the "1" and "0" voltages. Sense amplifiers are activated at time $t_3$ to amplify the difference voltage between the accessed bit line and the complementary bit line. When respective bit line voltages are fully amplified, the read "0" curve cell charge has increased from Qr to Qs. By way of comparison, the read "1" data state has changed from a stored "1" to a stored "0". Thus, the read "0" operation is nondestructive, but the read "1" operation is destructive. At time $t_4$, plate line PL goes low and applies −Vmax to the read "1" cell, thereby storing −Qs. At the same time, zero voltage is applied to the read "0" cell and charge Qr is restored. At the end of the read cycle, signal PRE goes high and precharges both bit lines BL to zero volts or ground. Thus, zero volts is applied to the read "1" cell and −Qr is restored.

Figure 5:
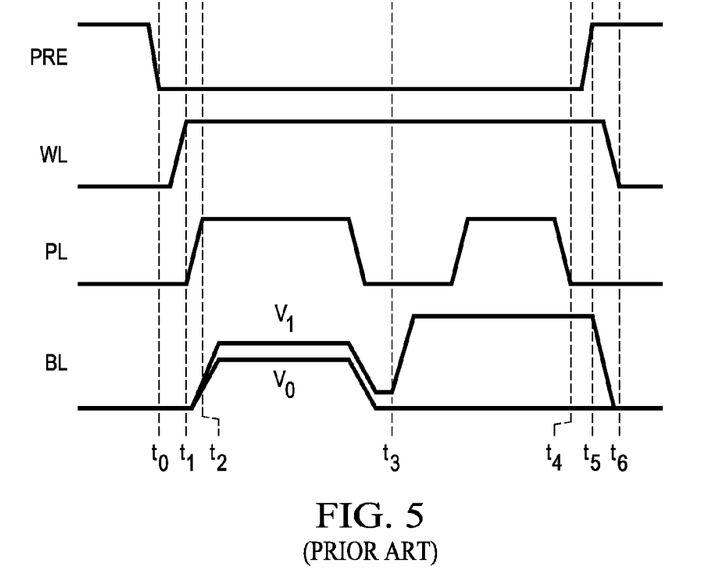
FIG. 5 is a timing diagram of a pulse sense read cycle.

Referring now to FIG. 5, a pulse sensing read operation is illustrated for a ferroelectric memory circuit. The read operation begins at time $t_0$ when precharge signal PRE goes low, permitting the bit lines BL to float. Word line WL and plate line PL are initially low, and bit lines BL are precharged low. At time $t_1$, word line WL goes high, thereby coupling a ferroelectric capacitor to a respective bit line. Then plate line PL goes high at time $t_2$, thereby permitting each memory cell to share charge with the respective bit line. The ferroelectric memory cells share charge with their respective bit lines BL and develop respective difference voltages. Here, $V_1$ represents a data "1" and $V_0$ represents a data "0". Plate line PL then goes low prior to time $t_3$, and the common mode difference voltage goes to near zero. The difference voltage available for sensing is the difference between one of $V_1$ and $V_0$ at time $t_3$ and a reference voltage (not shown) which lies approximately midway between voltages $V_1$ and $V_0$ at time $t_3$. The difference voltage is amplified at time $t_3$ by respective sense amplifiers and full bit line BL voltages are developed while the plate line PL is low. Thus, the data "1" cell is fully restored while plate line PL is low and the data "1" bit line BL is high. Subsequently, the plate line PL goes high while the data "0" bit line BL remains low. Thus, the data "0" cell is restored. The plate line PL goes low at time $t_4$, and precharge signal PRE goes high at time $t_5$. The high level of precharge signal PRE precharges the bit lines to ground or Vss. The word line WL goes low at time $t_6$, thereby isolating the ferroelectric capacitor from the bit line and completing the pulse sensing cycle.

Figure 6:
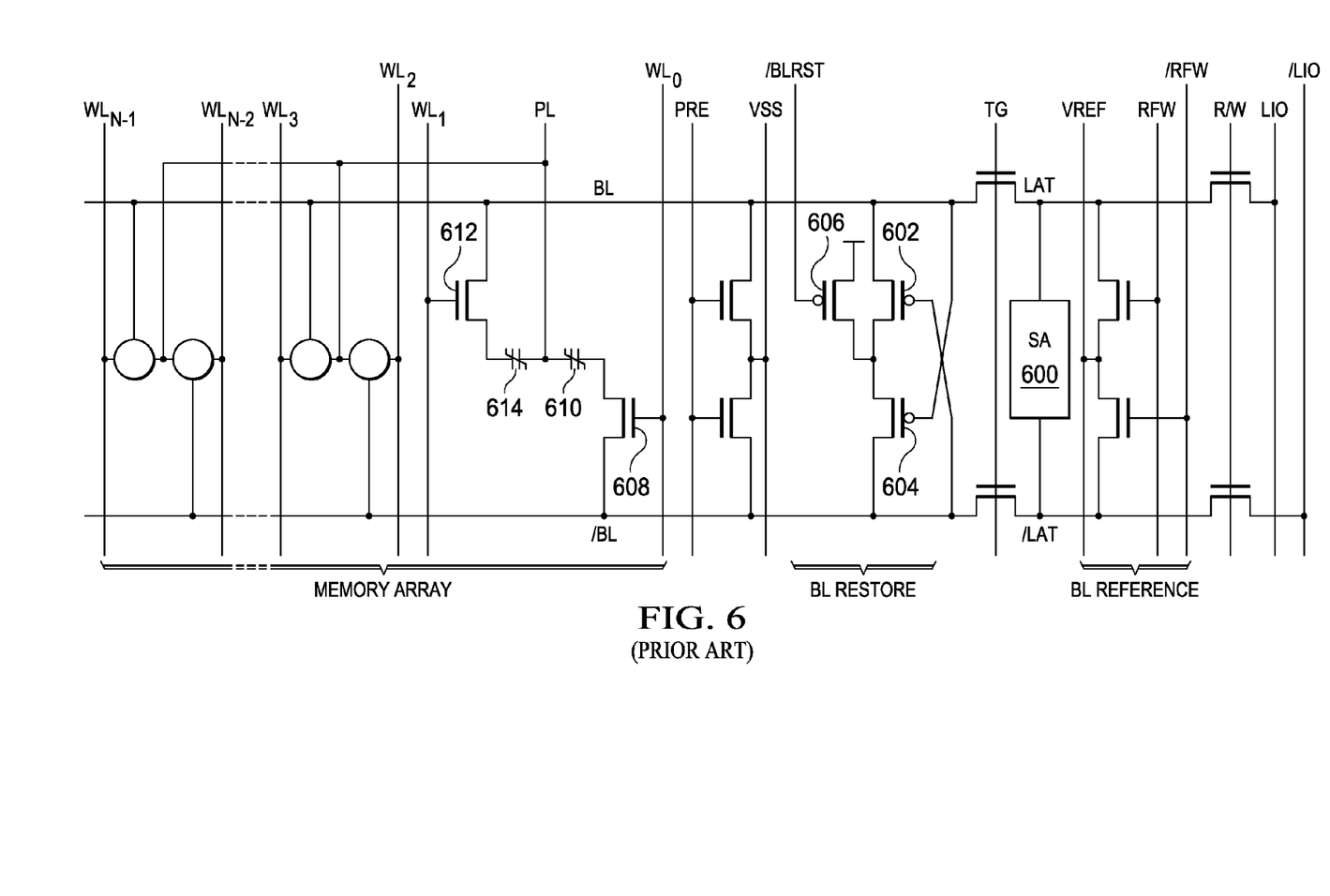
FIG. 6 is a schematic diagram of a column of ferroelectric memory cells of the prior art.

Referring to FIG. 6, there is a schematic diagram of a column of ferroelectric memory cells of the prior art. A ferroelectric memory array includes plural columns of memory cells arranged in parallel. The memory array also includes plural rows of memory cells defined by N parallel word lines $WL_0$ through $WL_{N-1}$. The memory cells are arranged in pairs and coupled to adjacent word lines and complementary bit lines BL and /BL. For example, word line $WL_0$ is connected to a control terminal of access transistor 608. Access transistor 608 has a current path coupled between bit line /BL and ferroelectric capacitor 610. Ferroelectric capacitor 610 is coupled to a common plate line terminal PL. Word line $WL_1$ is connected to a control terminal of access transistor 612. Access transistor 612 has a current path coupled between bit line BL and ferroelectric capacitor 614. Ferroelectric capacitor 614 is also coupled to a common plate line terminal PL. The column further includes a bit line precharge circuit having two n-channel transistors arranged to precharge bit lines BL and /BL to VSS or ground in response to a high level of precharge signal PRE.

A bit line restore circuit includes p-channel transistors 602 through 606 and is arranged to restore either bit line BL or /BL to VDD during a read or write back operation in response to a data state. N-channel transfer gate transistors couple bit lines BL and /BL to latch lines LAT and /LAT, respectively, in response to control signal TG. A bit line reference circuit is arranged to apply voltage VREF to one of bit lines BL and /BL during a read operation. For example, if a memory cell connected to bit line BL is selected, complementary bit line /BL receives reference voltage VREF. Likewise, if a memory cell connected to bit line /BL is selected, bit line BL receives reference voltage VREF. Sense amplifier 600 amplifies a difference voltage between bit lines BL and /BL during a read operation in response to control signal SAEN (not shown in FIG. 6) which enables sense amplifier 600 and applies the amplified data signal to complementary local I/O lines LIO and /LIO via n-channel read/write transistors in response to a high level of control signal R/W.

The one-transistor, one-capacitor (1T1C) memory cell of FIG. 6 offers an advantage of small layout area. One disadvantage, however, is that each word line must be raised at least an n-channel transistor threshold (Vt) above the greatest bit line voltage to transfer a full level of VDD to the memory cell. For example, if bit line (BL) voltage is 1.6 V and the threshold voltage of n-channel access transistor 612 is 0.5 V, then word line $WL_1$ must be raised to at least 2.1 V to apply the full 1.6 V to ferroelectric capacitor 614. This requires a high voltage word line drive circuit as well as high voltage access transistors in the memory cells. High voltage transistors required for the word line drive circuit and for the access transistors increase process complexity and manufacturing cost.

Figure 7:
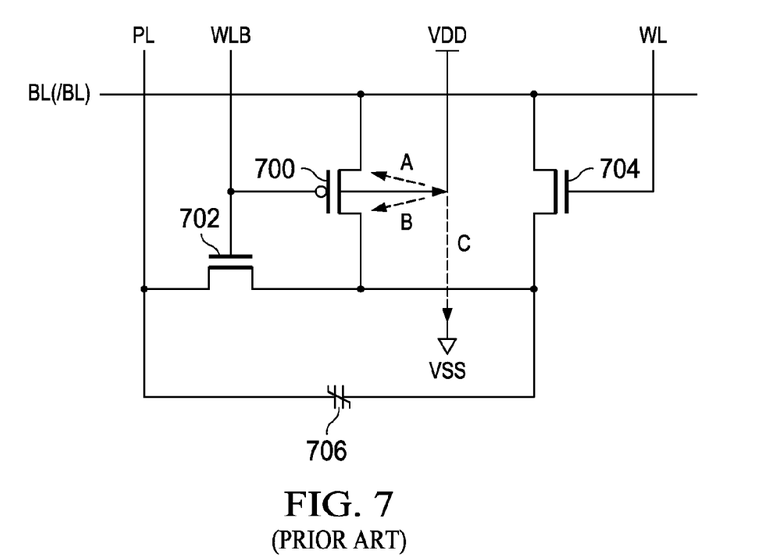
FIG. 7 is a schematic diagram showing parasitic leakage current paths of a three-transistor, one-capacitor (3T1C) ferroelectric memory cell of the prior art.

Referring to FIG. 7, there is a schematic diagram showing parasitic leakage current paths of a three-transistor, one-capacitor (3T1C) ferroelectric memory of the prior art as disclosed in U.S. Pat. No. 7,804,702 (TI-62631), filed Feb. 29, 2008, and incorporated herein by reference in its entirety. The 3T1C cell or 4T1C cell disclosed therein may be used to replace the 1T1C memory cells of FIG. 6. These cells advantageously eliminate the need for high voltage transistors in the word line drive circuit and in the memory cells. The 3T1C memory cell includes n-channel access transistor 704 having a current path between bit line BL(/BL) and ferroelectric capacitor 706 and having a gate coupled to word line WL. A p-channel access transistor 700 has a parallel current path between bit line BL(/BL) and ferroelectric capacitor 706 and a gate coupled to complementary word line WLB. An n-channel shunt transistor 702 has a current path connected across ferroelectric capacitor 706 to prevent any undesired coercive voltage as previously discussed with regard to FIG. 2. The gate of n-channel transistor 702 is also connected to complementary word line WLB.

In operation, word line WL is normally low and complementary word line WLB is normally high when the memory cell of FIG. 7 is unselected. In this mode, p-channel transistor 700 and n-channel transistor 704 are off. Plate line PL is low. Shunt transistor 702, however, is on to assure long-term data retention in ferroelectric capacitor 706. When the memory cell of FIG. 7 is selected, word line WL goes high and complementary word line WLB goes low. This turns off n-channel shunt transistor 702 and connects ferroelectric capacitor 706 to bit line BL(/BL) via p-channel access transistor 700 and n-channel access transistor 704. Because of the complementary conductivity of the access transistors, it is not necessary to drive either word line WL or complementary word line WLB beyond the normal operating voltage range of 0 V to VDD. This advantageously permits the use of low voltage transistors as in peripheral circuits and avoids a need for high voltage transistors in either the memory cells or in word line drive circuits. One problem with this memory cell, however, is shown as parasitic current leakage paths A-C when the memory cell is unselected. During an active mode of operation such as a read or write operation, these parasitic leakage path currents are negligible compared to the active current. In standby or sleep modes of operation, however, they may significantly degrade the battery charge in portable electronic devices.

Path A is a parasitic leakage current path from the n-well or bulk terminal to the drain of p-channel transistor 700. The bit line BL(/BL) is normally precharged to VSS or ground and the n-well or bulk terminal is at VDD in standby and sleep modes. This leakage path may be, for example, 1.37 pA for an unselected bit line. Path B is a parasitic leakage current path from the n-well or bulk terminal to the source of p-channel transistor 700. The plate line PL is normally held at to VSS or ground and the n-well or bulk terminal is at VDD. N-channel shunt transistor 702 conducts the current of path B to plate line PL and may be, for example, 1.37 pA. Path C is a parasitic leakage current path between n-well (VDD) and p-substrate (VSS). It is typically less than paths A and B due to the linear junction and may be, for example, 0.62 pA. The total parasitic current leakage for paths A-C, therefore, may be 3.36 pA for each memory cell or 4.30 μA for a 1.28 Mbit memory array. The present invention is directed to avoiding these and other disadvantages as will be discussed in detail.

BRIEF SUMMARY OF THE INVENTION

In a preferred embodiment of the present invention, a method of reducing leakage current in a memory circuit is disclosed. The method includes connecting a first power supply voltage terminal to a bulk terminal of a transistor in an active mode of operation. The method further includes detecting a low power mode of operation and disconnecting the first power supply voltage terminal from the bulk terminal in response to the step of detecting.

DETAILED DESCRIPTION OF THE INVENTION

Preferred embodiments of the present invention provide significant advantages in power reduction during standby and sleep modes of a circuit. In the following discussion, standby and sleep modes are both low power modes of operation of a memory or other circuit. A sleep mode is a lower power mode than standby and typically requires a greater latency period than standby in order to return to an active mode. The circuit maintains some functionality in these low power modes as compared to circuits where the operating voltage is removed and the circuit is turned off.

Figure 8A:
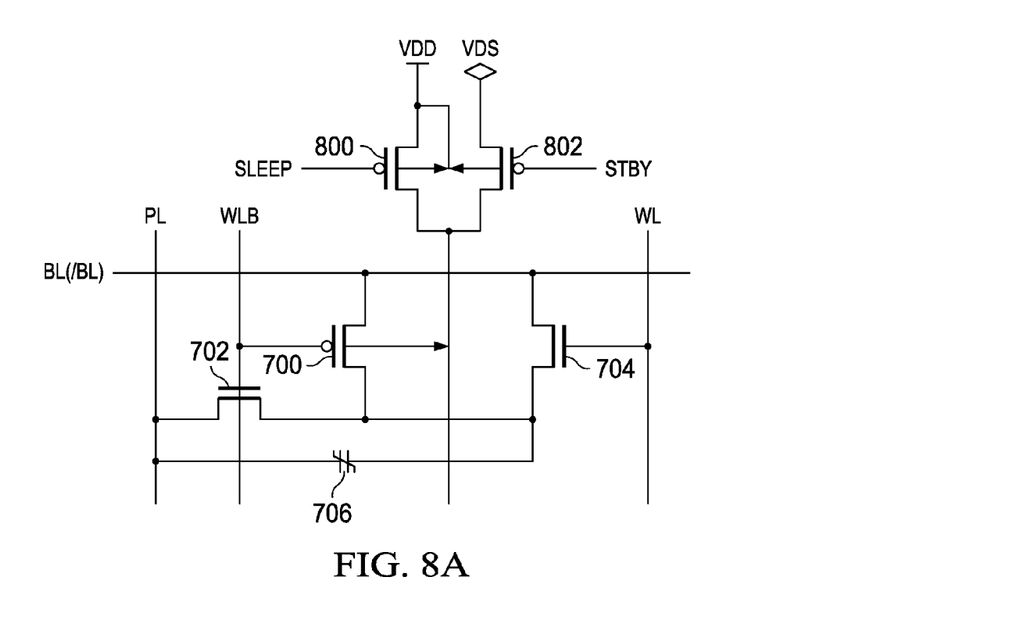
FIGS. 8A and 8B are schematic diagrams of memory circuits of the present invention to significantly reduce leakage current in respective 3T1C and 4T1C ferroelectric memory cells.

Referring to FIG. 8A, there is a schematic diagram of a memory circuit of the present invention to significantly reduce leakage current in a 3T1C ferroelectric memory cell. Here and in the following discussion, the same reference numerals are used in the drawing figures to indicate common circuit elements. P-channel transistors 800 and 802 are used to selectively apply voltage to the n-well or bulk terminals of p-channel access transistors of the memory array as exemplified by the single 3T1C memory cell of FIG. 8. In active operation, control signal SLEEP is low and control signal STBY is high. Thus, p-channel transistor 800 is on and power supply voltage VDD is applied to the n-well or bulk terminals of all p-channel access transistors of the memory array. P-channel transistor 802 is off so that standby supply voltage VDS is disconnected from the memory array n-well or bulk terminals. If the memory circuit is not accessed for a predetermined time or a system processor directs a transition from active mode to sleep mode, control signal SLEEP goes high and control signal STBY remains high. In sleep mode, therefore, both p-channel transistors 800 and 802 are off and the n-well or bulk terminal of p-channel access transistors of the memory array are permitted to float. In this mode, no power supply current is supplied to the n-well or bulk terminals. Through normal parasitic leakage current the n-well or bulk terminal bias gradually decreases with respect to the source and drain terminals of p-channel access transistors such as p-channel access transistor 700. For example, in active mode the source and drain terminals of the p-channel access transistors were held to VSS and their bulk terminals (n-well) were held to VDD by p-channel transistor 800. Thus, the source and drain junctions of each p-channel access transistor were reverse biased by 1.6 V with respect to the n-well or bulk terminal. When the p-channel bulk terminals (n-well) are allowed to float, their bias degrades to approximately 0 V over time and parasitic leakage current through paths A-C is negligible.

When the memory circuit is not accessed for a predetermined time or a system processor directs a transition from active mode to standby mode, control signal SLEEP goes high and control signal STBY goes low. In standby mode, therefore, p-channel transistor 800 is off and p-channel transistor 802 is on. Thus, the n-well or bulk terminal of p-channel access transistors of the memory array are disconnected from power supply voltage source VDD and connected to standby supply voltage source VDS. Standby voltage source VDS is preferably less than power supply voltage VDD and permits the memory array to return to an active mode of operation such as a read or write mode with much less latency than is sleep mode. In this mode, power supply current is greatly reduced to the n-well or bulk terminals due to the reduced reverse bias of the p-channel source and drain terminals with respect to the bulk terminal (n-well). For example, in active mode the source and drain terminals of the p-channel access transistors were held to VSS and their bulk terminals (n-well) were held to VDD (1.6 V) by p-channel transistor 800. Thus, the parasitic source and drain junctions of each p-channel access transistor were reverse biased by 1.6 V. When the p-channel bulk terminals (n-well) are held to 0.8 V in standby mode, parasitic leakage current through paths A-C is greatly reduced with only 0.8 V reverse bias. The latency period for the memory circuit to return to active mode is greatly reduced.

Figure 8B:
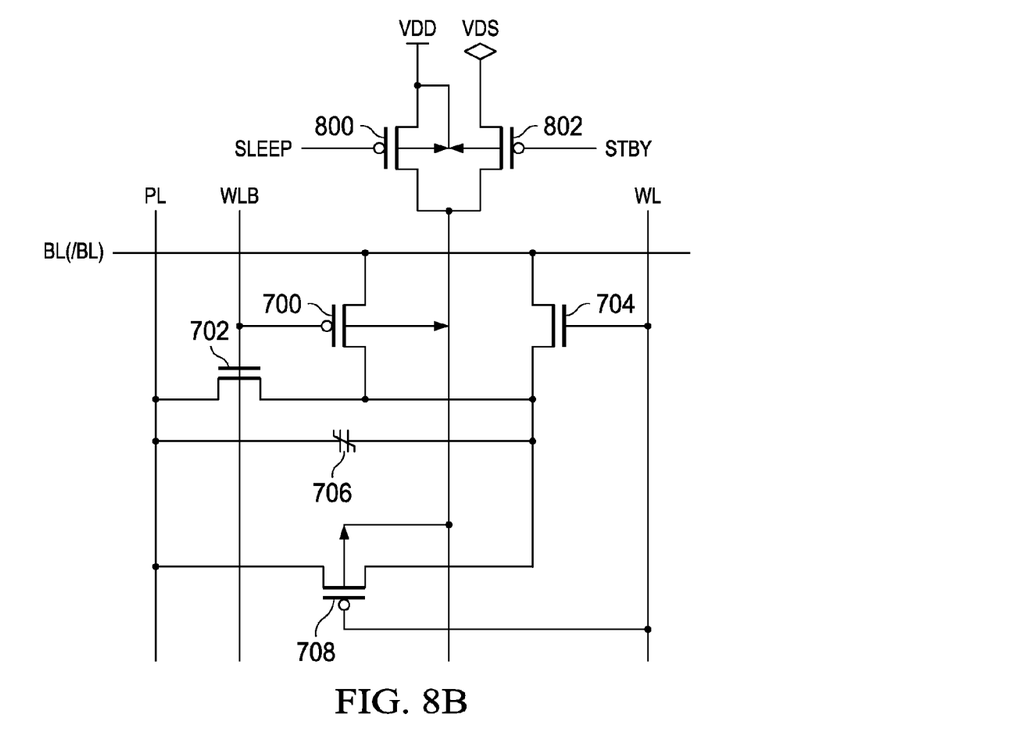

FIG. 8B is a schematic diagram of a memory circuit having a four-transistor, one-capacitor (4T1C) ferroelectric memory cell. It is the same as FIG. 8A except that the current path of p-channel transistor 708 is connected in parallel with the current path of n-channel transistor 702. The gate of p-channel transistor 708 is connected to word line WL. In operation, when the memory cell is unselected word line WL is low and complementary word line WLB is high. Thus, n-channel transistor 702 and p-channel transistor 708 are both on and serve as a parallel shunt for ferroelectric capacitor 706. When the memory cell is selected, word line WL goes high and complementary word line WLB goes low. Thus, n-channel transistor 702 and p-channel transistor 708 are both off when the 4T1C memory cell is selected.

Figure 9A:
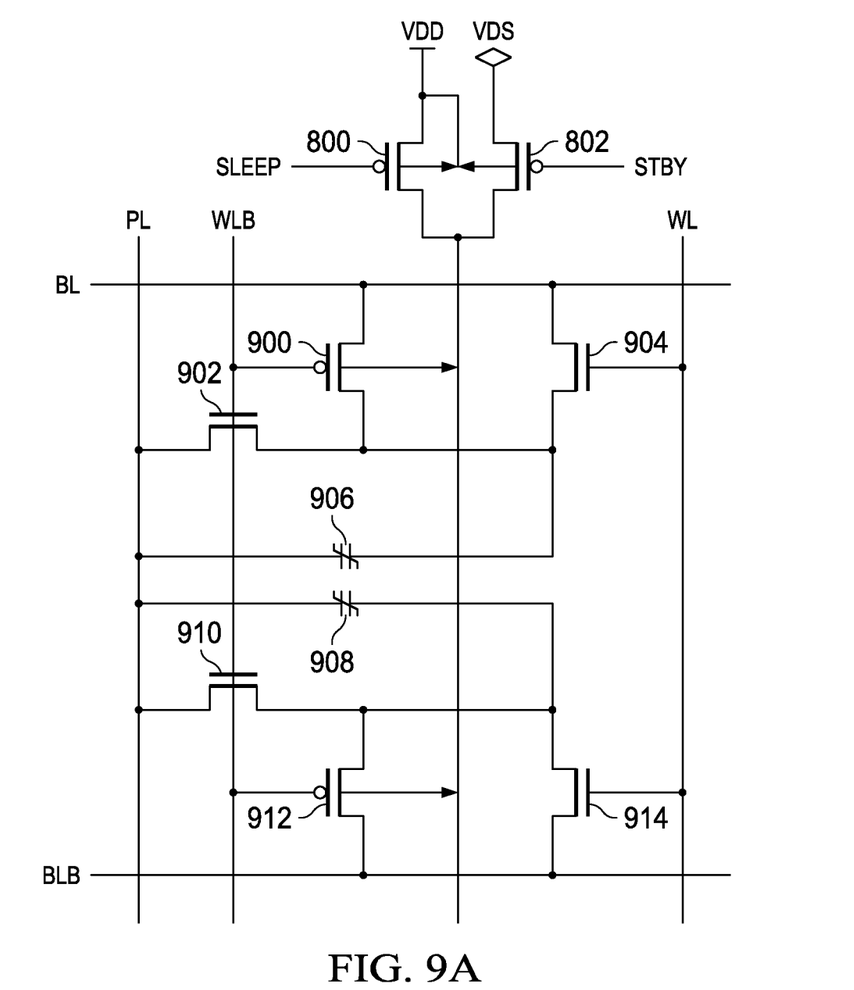
FIGS. 9A and 9B are schematic diagrams of memory circuits of the present invention to significantly reduce leakage current in respective 6T2C and 8T2C ferroelectric memory cells.

Referring next to FIG. 9A, there is a schematic diagram of another memory circuit of the present invention to significantly reduce leakage current in a six-transistor, two-capacitor (6T2C) ferroelectric memory cell. This embodiment of the present invention employs a ferroelectric memory array of 6T2C memory cells as in FIG. 9 to increase the signal margin by producing a data signal on both BL and /BL during a read operation. The parasitic leakage components are the same as previously described with regard to FIG. 7. Here, however, each memory cell includes p-channel access transistors 900 and 912, n-channel access transistors 904 and 914, n-channel shunt transistors 902 and 910, and ferroelectric capacitors 906 and 908. During a read operation, word line WL goes high and complementary word line WLB goes low. Access transistors 900 and 904 couple data from ferroelectric capacitor 906 to bit line BL. Likewise, access transistors 912 and 914 couple data from ferroelectric capacitor 908 to complementary bit line /BL. The difference voltage between BL and /BL is then amplified as previously described with regard to FIG. 6.

In active operation, control signal SLEEP is low and control signal STBY is high. Thus, p-channel transistor 800 is on and power supply voltage VDD is applied to the n-well or bulk terminals of all p-channel access transistors of the memory array. P-channel transistor 802 is off so that standby supply voltage VDS is disconnected from the memory array n-well or bulk terminals. If the memory circuit is not accessed for a predetermined time or a system processor directs a transition from active mode to sleep mode, control signal SLEEP goes high and control signal STBY remains high. In sleep mode, therefore, both p-channel transistors 800 and 802 are off and the n-well or bulk terminal of p-channel access transistors of the memory array are permitted to float. In this mode, no power supply current is supplied to the n-well or bulk terminals. Through normal leakage current the n-well or bulk terminal bias gradually decreases with respect to the source and drain terminals of p-channel access transistors such as p-channel access transistors 900 and 912. For example, in active mode the source and drain terminals of the p-channel access transistors were held to VSS and their bulk terminals (n-well) were held to VDD by p-channel transistor 800. Thus, the parasitic source and drain junctions of each p-channel access transistor were reverse biased by 1.6 V. When the p-channel bulk terminals (n-well) are allowed to float, their bias degrades to approximately 0 V over time and parasitic leakage current through paths A-C is negligible.

When the memory circuit is not accessed for a predetermined time or a system processor directs a transition from active mode to standby mode, control signal SLEEP goes high and control signal STBY goes low. In standby mode, therefore, p-channel transistor 800 is off and p-channel transistor 802 is on. Thus, the n-well or bulk terminal of p-channel access transistors of the memory array are disconnected from power supply voltage source VDD and connected to standby supply voltage source VDS. Standby voltage source VDS is preferably less than power supply voltage VDD and permits the memory array to return to an active mode of operation such as a read or write mode with much less latency than is sleep mode. In this mode, power supply current is greatly reduced to the n-well or bulk terminals due to the reduced reverse bias of the p-channel source and drain terminals and the p-substrate (path C of FIG. 7) with respect to the bulk terminal (n-well). For example, in active mode the source and drain terminals of the p-channel access transistors were held to VSS and their bulk terminals (n-well) were held to VDD by p-channel transistor 800. Thus, the parasitic source and drain junctions of each p-channel access transistor were reverse biased by VDD or 1.6 V. When the p-channel bulk terminals (n-well) are held to 0.8 V in standby mode parasitic leakage current through paths A-C is greatly reduced with only 0.8 V reverse bias. The latency period for the memory circuit to return to active mode is greatly reduced.

Figure 9B:
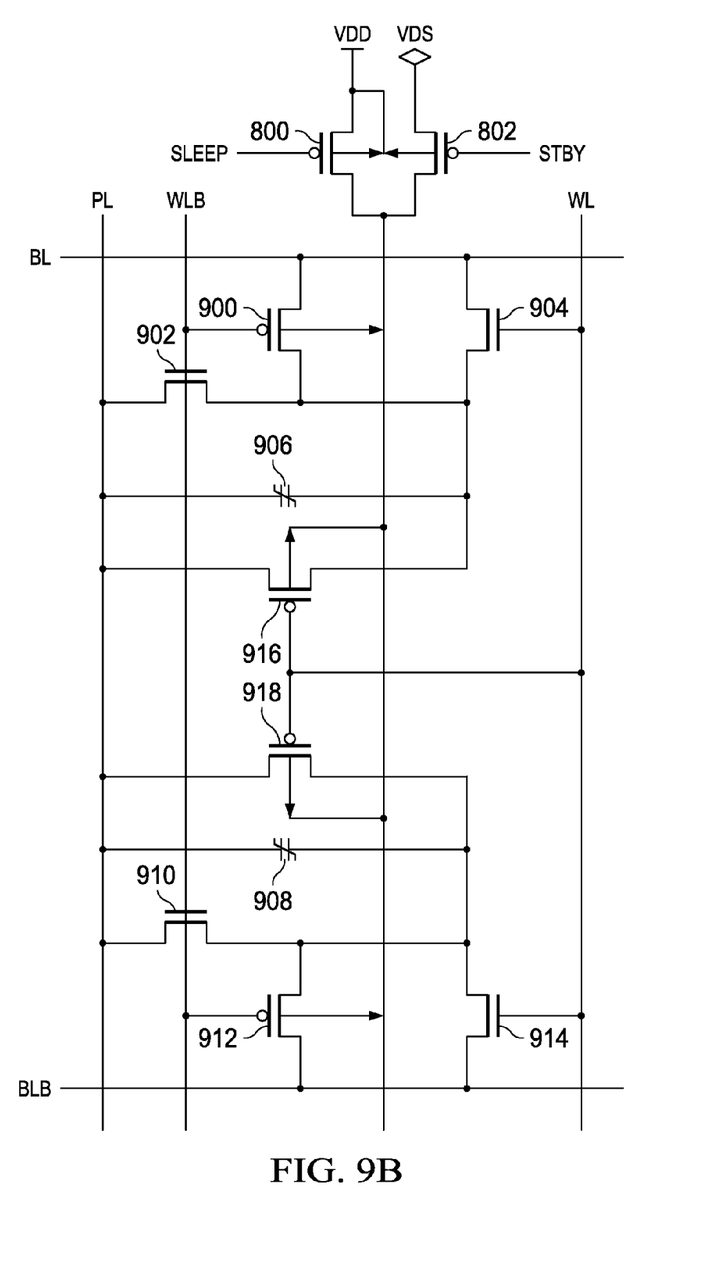

FIG. 9B is a schematic diagram of yet another memory circuit having an eight-transistor, two-capacitor (8T2C) ferroelectric memory cell. It is the same as FIG. 9A except that the current path of p-channel transistors 916 and 918 are respectively connected in parallel with the current paths of n-channel transistors 902 and 910. The gates of p-channel transistors 916 and 918 are both connected to word line WL. In operation, when the memory cell is unselected word line WL is low and complementary word line WLB is high. Thus, n-channel transistor 902 and p-channel transistor 916 are both on and serve as a parallel shunt for ferroelectric capacitor 906. Likewise, n-channel transistor 910 and p-channel transistor 918 are both on and serve as a parallel shunt for ferroelectric capacitor 908. When the memory cell is selected, word line WL goes high and complementary word line WLB goes low. Thus, n-channel transistors 902 and 910 and p-channel transistors 916 and 918 are both off when the 8T2C memory cell is selected.

Figure 10:
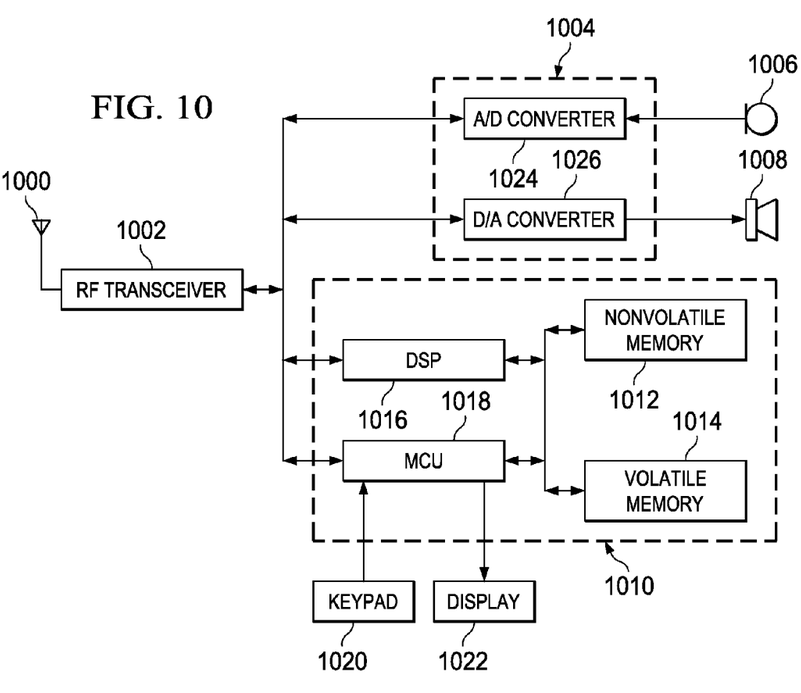
FIG. 10 is a block diagram of a wireless telephone as an example of a portable electronic device which could advantageously employ the present invention.

Referring to FIG. 10, there is a block diagram of a wireless telephone as an example of a portable electronic device which could advantageously employ this invention in a nonvolatile memory array. The wireless telephone includes antenna 1000, radio frequency transceiver 1002, base band circuits 1010, microphone 1006, speaker 1008, keypad 1020, and display 1022. The wireless telephone is preferably powered by a rechargeable battery (not shown) as is well known in the art. Antenna 1000 permits the wireless telephone to interact with the radio frequency environment for wireless telephony in a manner known in the art. Radio frequency transceiver 1002 both transmits and receives radio frequency signals via antenna 1000. The transmitted signals are modulated by the voice/data output signals received from base band circuits 1010. The received signals are demodulated and supplied to base band circuits 1010 as voice/data input signals. An analog section 1004 includes an analog to digital converter 1024 connected to microphone 1006 to receive analog voice signals. The analog to digital converter 1024 converts these analog voice signals to digital data and applies them to digital signal processor 1016. Analog section 1004 also includes a digital to analog converter 1026 connected to speaker 1008. Speaker 1008 provides the voice output to the user. Digital section 1010 is embodied in one or more integrated circuits and includes a microcontroller unit 1018, a digital signal processor 1016, nonvolatile memory circuit 1012, and volatile memory circuit 1014. Nonvolatile memory circuit 1012 may include read only memory (ROM), ferroelectric memory (FeRAM or FRAM), FLASH memory, or other nonvolatile memory as known in the art. Volatile memory circuit 1014 may include dynamic random access memory (DRAM), static random access memory (SRAM), or other volatile memory circuits as known in the art. Microcontroller unit 1018 interacts with keypad 1020 to receive telephone number inputs and control inputs from the user. Microcontroller unit 1018 supplies the drive function to display 1022 to display numbers dialed, the current state of the telephone such as battery life remaining, and received alphanumeric messages. Digital signal processor 1016 provides real time signal processing for transmit encoding, receive decoding, error detection and correction, echo cancellation, voice band filtering, etc. Both microcontroller unit 1018 and digital signal processor 1016 interface with nonvolatile memory circuit 1012 for program instructions and user profile data. Microcontroller unit 1018 and digital signal processor 1016 also interface with volatile memory circuit 1014 for signal processing, voice recognition processing, and other applications.

Still further, while numerous examples have thus been provided, one skilled in the art should recognize that various modifications, substitutions, or alterations may be made to the described embodiments while still falling with the inventive scope as defined by the following claims. For example, the present invention may be applied to individual subarrays so that some subarrays are in active mode while other subarrays are in standby or sleep modes. Moreover, advantages of the present invention also apply to other types of circuits that would benefit from reduced power consumption in standby or sleep modes. Other combinations will be readily apparent to one of ordinary skill in the art having access to the instant specification.

What is claimed is:

1. A method of reducing leakage current in a memory circuit, comprising:
   connecting a first supply voltage terminal to a bulk terminal of a first transistor of the memory circuit in an active mode of operation;
   applying a high level of a control signal to at least one terminal of a memory cell of the memory circuit;
   detecting a first low power mode of operation of the memory circuit; and
   disconnecting the first supply voltage terminal from the bulk terminal during the step of applying and floating the bulk terminal in response to the step of detecting.

2. A method as in claim 1, wherein the control signal is one of a word line and a complementary word line voltage.

3. A method as in claim 1, comprising:
   detecting a second low power mode of operation; and
   connecting a second power supply voltage terminal to the bulk terminal in response to the step of said detecting a second low power mode of operation.

4. A method as in claim 1, wherein the first transistor is an access transistor of the memory cell.

5. A method as in claim 1, wherein the memory circuit comprises one of a three-transistor, one-capacitor (3T1C) and a four-transistor, one-capacitor (4T1C) ferroelectric memory cell.

6. A method as in claim 1, wherein the memory circuit comprises one of a six-transistor, two-capacitor (6T2C) and an eight-transistor, two capacitor (8T2C) ferroelectric memory cell.

7. A method as in claim 1, comprising connecting a current path of a second transistor in parallel with a current path of the first transistor, the second transistor having a complementary conductivity type with respect to the first transistor.

8. A memory circuit, comprising:
   a first power supply terminal;
   a first access transistor having a current path and a bulk terminal; and
   a first switching transistor having a current path coupled between the first power supply terminal and the bulk terminal and having a control terminal coupled to receive a first control signal having a first logic state to disconnect the bulk terminal from the first power supply terminal, thereby floating the bulk terminal while at least one terminal of a memory cell of the memory circuit receives a high level control signal.

9. A memory circuit as in claim 8, wherein the first logic state of the first control signal is a sleep mode signal.

10. A memory circuit as in claim 8, wherein a second logic state of the first control signal connects the bulk terminal to the first power supply terminal.

11. A memory circuit as in claim 10, wherein the second logic state is an active mode signal.

12. A memory circuit as in claim 8, comprising:
    a second power supply terminal; and
    a second switching transistor having a current path coupled between the second power supply terminal and the bulk terminal and having a control terminal coupled to receive a second control signal to connect the bulk terminal to the second power supply terminal.

13. A memory circuit as in claim 12, wherein the second control signal is a standby mode signal.

14. A memory circuit as in claim 8, comprising:
    a bit line coupled to a first terminal of the current path of the first access transistor; and
    a nonvolatile memory element coupled to a second terminal of the current path of the first access transistor.

15. A memory circuit as in claim 14, comprising a second access transistor having a current path connected in parallel with the current path of the first access transistor, the second access transistor having a complementary conductivity type with respect to the first access transistor.

16. A memory circuit as in claim 15, wherein the circuit comprises one of a three-transistor, one-capacitor (3T1C), four-transistor, one-capacitor (4T1C), six-transistor, two-capacitor (6T2C), and eight-transistor, two-capacitor (8T2C) ferroelectric memory cell.

17. A method of reducing leakage current in a memory cell, comprising:
    applying a first power supply voltage to a control terminal of a transistor of the memory cell;
    applying the first power supply voltage to a bulk terminal of the transistor in an active mode of operation;
    detecting a low power mode of operation of the transistor; and
    removing the first supply voltage from the bulk terminal, thereby floating the bulk terminal and maintaining the first power supply voltage at the control terminal in response to the step of detecting.

18. A method as in claim 17, wherein the memory cell is one of a three-transistor, one-capacitor (3T1C), four-transistor, one-capacitor (4T1C), six-transistor, two-capacitor (6T2C), and eight-transistor, two-capacitor (8T2C) ferroelectric memory cell.

19. A method as in claim 17, comprising:
determining that the low power mode of operation is a standby mode; and
connecting a second power supply voltage terminal to the bulk terminal in response to the step of determining.

20. A method as in claim 17, wherein the low power mode of operation is a sleep mode signal.

* * * * *